(12) United States Patent
Huynh et al.

(10) Patent No.: US 10,590,539 B2
(45) Date of Patent: Mar. 17, 2020

(54) NANOFIBER THERMAL INTERFACE MATERIAL

(71) Applicant: Lintec of America, Inc., Richardson, TX (US)

(72) Inventors: Chi Huynh, Richardson, TX (US); Masaharu Ito, Richardson, TX (US)

(73) Assignee: LINTEC OF AMERICA, INC., Richardson, TX (US)

( * ) Notice: Subject to any disclaimer, the term of this patent is extended or adjusted under 35 U.S.C. 154(b) by 0 days.

(21) Appl. No.: 15/903,420

(22) Filed: Feb. 23, 2018

(65) Prior Publication Data

US 2018/0245219 A1    Aug. 30, 2018

Related U.S. Application Data

(60) Provisional application No. 62/463,034, filed on Feb. 24, 2017.

(51) Int. Cl.
| | | |
|---|---|---|
| C23C 16/56 | (2006.01) | |
| C23C 16/44 | (2006.01) | |
| C01B 32/15 | (2017.01) | |
| C23C 16/40 | (2006.01) | |

(52) U.S. Cl.
CPC .............. *C23C 16/56* (2013.01); *C01B 32/15* (2017.08); *C23C 16/4418* (2013.01); *C23C 16/402* (2013.01); *C23C 16/403* (2013.01)

(58) Field of Classification Search
None
See application file for complete search history.

(56) References Cited

U.S. PATENT DOCUMENTS

| | | |
|---|---|---|
| 7,056,409 B2 | 6/2006 | Dubrow |
| 7,067,328 B2 | 6/2006 | Dubrow et al. |
| 7,074,294 B2 | 7/2006 | Dubrow |
| 7,273,095 B2 | 9/2007 | Li et al. |
| 7,344,617 B2 | 3/2008 | Dubrow |
| 7,641,885 B2 | 1/2010 | Liu et al. |
| 7,648,406 B2 | 1/2010 | Tai et al. |
| 7,651,769 B2 | 1/2010 | Dubrow |

(Continued)

FOREIGN PATENT DOCUMENTS

| | | |
|---|---|---|
| JP | 2004338982 | 12/2004 |
| JP | 2007516093 A | 6/2007 |

(Continued)

OTHER PUBLICATIONS

Non-Final Office Action for Japanese Patent Application No. 2017-565281, dated Jun. 1, 2018, 7 pages including English translation.

(Continued)

*Primary Examiner* — Michael P. Rodriguez
(74) *Attorney, Agent, or Firm* — Finch & Maloney PLLC

(57) ABSTRACT

A nanofiber structure is described that is composed of a substrate and a layer of oriented nanofibers. Nanofibers of the layer can be oriented in a common direction. An angle of the common direction can be selected so that nanofibers of the sheet are oriented at an angle with respect to an underlying substrate even if the underlying substrate is not planar. The angle can be used to adapt the sheets to demands as a thermal interface material.

19 Claims, 12 Drawing Sheets

(56) References Cited

U.S. PATENT DOCUMENTS

| | | |
|---|---|---|
| 7,662,467 B2 | 2/2010 | Li et al. |
| 7,811,149 B2 | 10/2010 | Liu et al. |
| 8,007,617 B2 | 8/2011 | Min et al. |
| 9,067,791 B2 | 6/2015 | Kim et al. |
| 9,095,639 B2 | 8/2015 | Ajayan et al. |
| 2005/0062024 A1 | 3/2005 | Bessette et al. |
| 2005/0066883 A1 | 3/2005 | Dubrow et al. |
| 2006/0057388 A1 | 3/2006 | Jin et al. |
| 2007/0090489 A1 | 4/2007 | Hart et al. |
| 2007/0128960 A1 | 6/2007 | Ghasemi Nejhad et al. |
| 2007/0207318 A1 | 9/2007 | Jin et al. |
| 2008/0014465 A1 | 1/2008 | Fearing et al. |
| 2008/0318049 A1 | 12/2008 | Hata et al. |
| 2009/0011232 A1 | 1/2009 | Dai et al. |
| 2009/0066352 A1 | 3/2009 | Gritters et al. |
| 2009/0126783 A1 | 5/2009 | Lin et al. |
| 2010/0075201 A1 | 3/2010 | Nakanishi et al. |
| 2010/0310809 A1 | 12/2010 | Jiang et al. |
| 2012/0125537 A1* | 5/2012 | Kabir .................. B82Y 10/00 156/306.9 |
| 2012/0285673 A1 | 11/2012 | Cola et al. |
| 2013/0118682 A1 | 5/2013 | Zeininger |
| 2013/0142987 A1 | 6/2013 | Wardle et al. |
| 2015/0147573 A1 | 5/2015 | Zhang et al. |
| 2015/0209761 A1 | 7/2015 | Cola |
| 2015/0314562 A1 | 11/2015 | Weisenberger |
| 2015/0360454 A1 | 12/2015 | Wei et al. |
| 2016/0012975 A1 | 1/2016 | Maruyama et al. |
| 2016/0362299 A1 | 12/2016 | Inoue et al. |
| 2018/0052336 A1 | 2/2018 | Huynh et al. |
| 2019/0077665 A1 | 3/2019 | Maruyama et al. |

FOREIGN PATENT DOCUMENTS

| | | |
|---|---|---|
| JP | 2007257886 | 10/2007 |
| JP | 2012111691 A | 6/2012 |
| JP | 2012188305 | 10/2012 |
| JP | 2013128323 | 6/2013 |
| JP | 2014154350 | 8/2014 |
| TW | 201601230 | 1/2016 |
| TW | 201710176 | 3/2017 |
| WO | 2005030636 A2 | 4/2005 |
| WO | 2005033237 A2 | 4/2005 |
| WO | 2012153772 | 11/2012 |
| WO | 2016201234 | 12/2016 |
| WO | 2017214474 A1 | 12/2017 |

OTHER PUBLICATIONS

Non-Final Office Action Taiwan Patent Application No. 106119334, dated Jun. 11, 2018, 10 pages including English translation.

Non-Final Rejection, received in U.S. Appl. No. 15/179,059, dated Aug. 10, 2018, 13 pages.

International Preliminary Report on Patentability, received in PCT Application No. PCT/US20161036901, dated Dec. 21, 2017, 8 pages.

International Search Report and Written Opinion, received in PCT Application No. PCT/US16/36901, dated Sep. 1, 2016, 14 pages.

International Search Report and Written Opinion, received in PCT Application No. PCT/US18/19396, dated May 16, 2018, 14 pages.

International Search Report with Written Opinion received in PCT Application No. PCT/US17/036687, dated Oct. 10, 2017, 14 pages.

Taiwan IPO Search Report received for Taiwan Patent Application No. 105118409, dated Mar. 21, 2017, 2 pages.

Yang et al., "Experimental Observation of an Extremely Dark Material Made by a Low-Density Nanotube Array", American Chemical Society, Nano Letters, vol. 8, No. 2, 2008, pp. 446-451, 6 pages.

Extended European Search Report received for EP Application No. 17811058.1, dated May 3, 2019, 2019. 9 pages.

International Preliminary Report on Patentability, received in PCT Application No. PCT/US2018/019396, dated Aug. 27, 2019. 7 pages.

Japanese Office Action received for JP Application No. 2018-189824. Dated Nov. 12, 2019. 9 pages, including English translation.

* cited by examiner

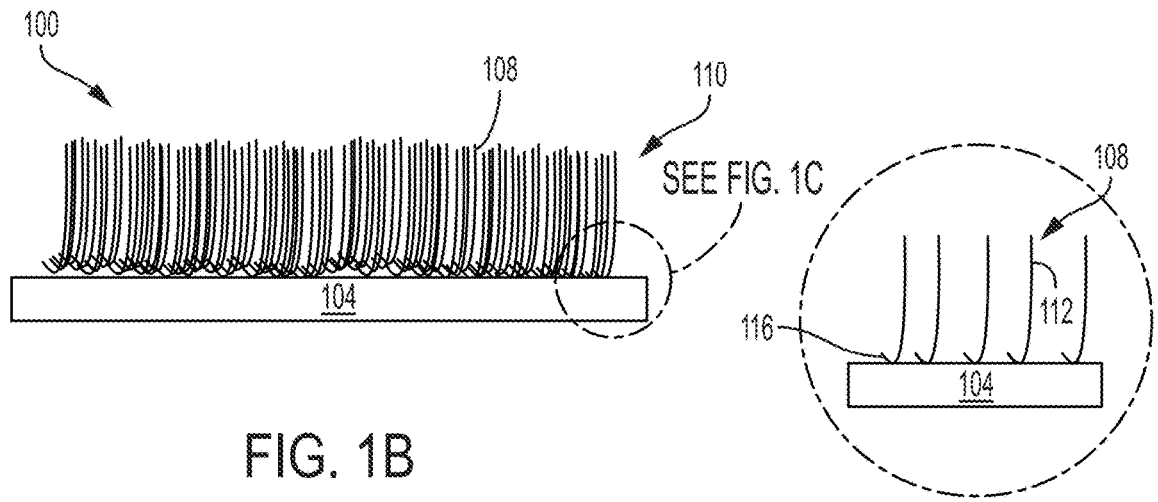
FIG. 1B
FIG. 1C
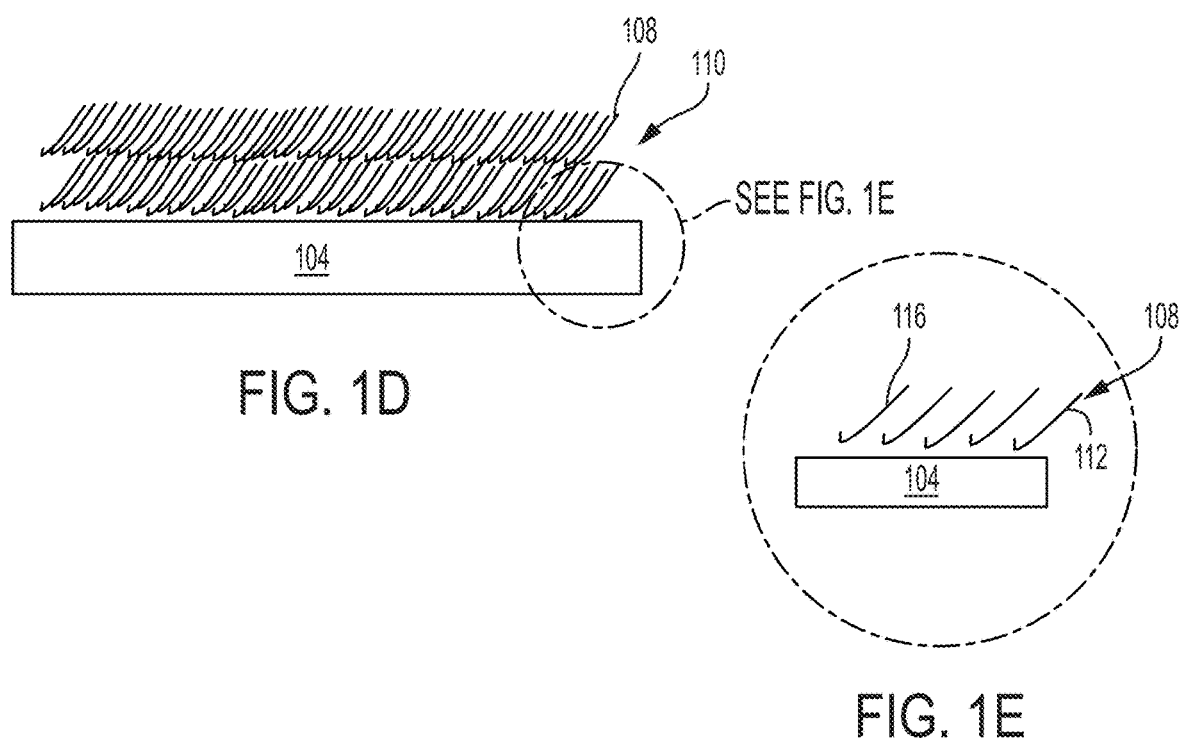
FIG. 1D
FIG. 1E

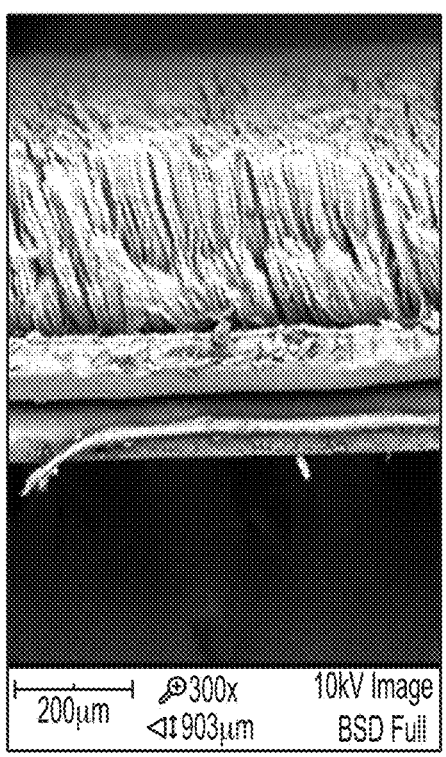 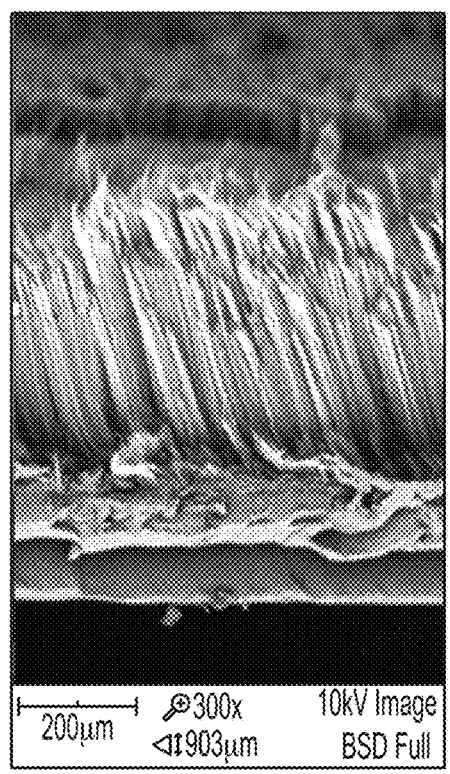
FIG. 2A　　　　　　　　　　FIG. 2B
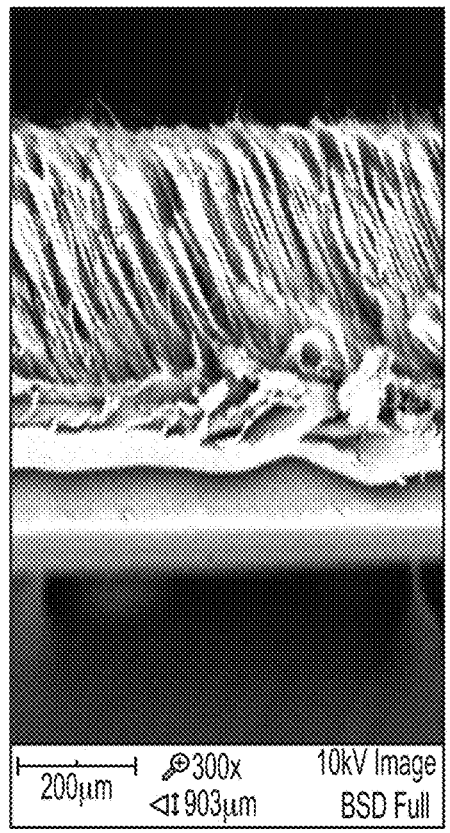
FIG. 2C

NANOFIBER THERMAL INTERFACE MATERIAL

TECHNICAL BACKGROUND

The present disclosure relates generally to materials that transmit radiation. Specifically, the present disclosure relates to a nanofiber layer that interacts with thermal radiation so as to form a nanofiber thermal interface material.

BACKGROUND

Removal of excess heat is a technological challenge faced in many different technological fields, including manufacturing, automotive applications, and microelectronics. Failure to remove excess heat (or alternatively, failure in maintaining a system temperature below a threshold) can compromise the operation and/or reliability of a system.

One challenge in the removal of heat is transmitting the excess heat from a heat source to a heat sink, the latter of which is configured to be cooled (e.g., with forced air convection or a liquid coolant) to remove heat from the system. Conduction from a heat source to a heat sink generally requires intimate contact between surfaces of the heat source and the heat sink. Adhesives used to attach a heat sink to a heat source, while helpful for maintaining uniform contact between the heat sink and the heat source, generally do not have thermal conductivities as high as would be preferred.

SUMMARY

Example 1 of the present disclosure includes a method comprising providing at least one layer of nanofibers on a substrate; placing the at least one layer of nanofibers between a heat sink and a heat source; disposing an adhesive layer between the at least one layer of nanofibers and at least one of the heat sink and the heat source; and heating the adhesive layer, the heating reducing a thickness of the adhesive layer from a first thickness to a second thickness less than the first thickness.

Example 2 includes the subject matter of Example 1, wherein the heat source is proximate to open ends of the nanofibers.

Example 3 includes the subject matter of either of Examples 1 or 2, wherein the adhesive layer comprises a first adhesive layer disposed between the layer of nanofibers and the heat sink and a second adhesive layer disposed between the layer of nanofibers and the heat source.

Example 4 includes the subject matter of any of Examples 1 to 3, wherein heating the adhesive layer comprises heating at a temperature of 300° C.

Example 5 includes the subject matter of any of Examples 1 to 4, wherein the first thickness is at least 7 microns and the second thickness is from 0.1 micron to 1 micron.

Example 6 includes the subject matter of any of Examples 1 to 5, wherein the at least one layer of nanofibers provided on a substrate further comprises a majority of the nanofibers oriented at an angle from 80° to 100° relative to a surface of the substrate.

Example 7 includes the subject matter of any of Examples 1 to 6, wherein reducing the thickness of the adhesive layer from the first thickness to the second thickness increases a thermal conductivity of, collectively, the adhesive layer and the at least one layer of nanofibers, from a first value to a second value greater than the first value.

Example 8 includes the subject matter of Example 7, wherein the first value of thermal conductivity is at least 30% less than the second value of the thermal conductivity.

Example 9 includes the subject matter of any of Examples 1 to 8, wherein the at least one layer of nanofibers conforms to a feature size on at least one of the heat source and the heat sink of 0.5 microns or greater.

Example 10 includes the subject matter of any of Examples 1 to 9, wherein an orientation of the nanofibers in the at least one layer placed between the heat source and the heat sink is from 80° to 100° relative to at least one of a surface of the heat source and a surface of the heat sink.

Example 11 of the present disclosure includes a method comprising: providing at least one layer of nanofibers on a substrate; configuring a layer of the at least one layer of nanofibers so that open ends of the nanofibers of the layer are disposed at an exposed surface; and placing the at least one layer of nanofibers between a heat sink and a heat source, at least one of the heat sink and the heat source proximate to the open ends of the nanofibers.

Example 12 includes the subject matter of Example 11, wherein a majority of nanofibers of the at least one layer provided on the substrate are oriented at an angle from 80° to 100° relative to a surface of the substrate.

Example 13 includes the subject matter of either of Examples of 11 or 12, wherein configuring the at least one layer of nanofibers so that open ends of the nanofibers of the layer are disposed at an exposed surface comprises: applying an adhesive substrate to a top layer of the at least one layer of nanofibers on the substrate; and applying a tensile force to the substrate and the adhesive substrate and causing the substrate and the adhesive substrate to separate from one another.

Example 14 includes the subject matter of any of Examples 11 to 12, wherein applying the adhesive substrate comprises: applying an adhesive to the top layer of the at least one layer of nanofibers; and applying a second substrate to the adhesive.

Example 15 includes the subject matter of either of Examples 13 to 14, wherein a ratio of adhesive strength of the adhesive substrate to the substrate is in a range from 4:1 to 400:1.

Example 16 includes the subject matter of any of Examples 11 to 15, wherein an angle of the nanofibers relative to a surface of at least one of the heat sink and the heat source is from 80° to 100° relative to the surface of the surface.

Example 17 includes the subject matter of any of Examples 11 to 16, further comprising disposing an adhesive layer between the at least one layer of nanofibers and at least one of the heat sink and the heat source.

Example 18 includes the subject matter of Example 17, further comprising heating the adhesive layer, the heating reducing a thickness of the adhesive layer from a first thickness to a second thickness less than the first thickness, the reduced thickness increasing a thermal conductivity of, collectively, the adhesive layer and the at least one layer of nanofiber from a first value to a second value greater than the first value.

Example 19 includes the subject matter of Example 18, wherein the first value is at least 30% less than the second value.

Example 20 includes the subject matter of any of Examples 11 to 18, wherein the heat source is proximate to open ends of the nanofibers.

BRIEF DESCRIPTION OF THE DRAWINGS

FIG. 1A' is a plan view SEM image of a tangled portion of a carbon nanotube forest, in an embodiment.

FIG. 1B is a schematic illustration of a nanofiber layer including a substrate and a plurality of nanofibers of a nanofiber forest that are disposed on the substrate, in an embodiment.

FIG. 1C is an enlarged view schematic illustration of a portion of the nanofiber layer shown in FIG. 1B, in which the individual nanofibers of the forest have a straight portion and an arcuate portion, in an embodiment.

FIG. 1D is a schematic illustration of a nanofiber layer including a substrate and a plurality of nanofibers of a nanofiber forest disposed on the substrate at an angle between 30° and 60° with respect to a surface of the substrate, in an embodiment.

FIG. 1E is an enlarged view schematic illustration of a portion of the nanofiber layer shown in FIG. 1D, in which the individual nanofibers have a straight portion and an arcuate portion, in an embodiment.

FIGS. 2A-2G are cross-sectional views of carbon nanotube forests in which individual nanotubes comprising the various forests have been angled with respect to a surface of the substrate using techniques described herein, in embodiments.

Figure 1A:
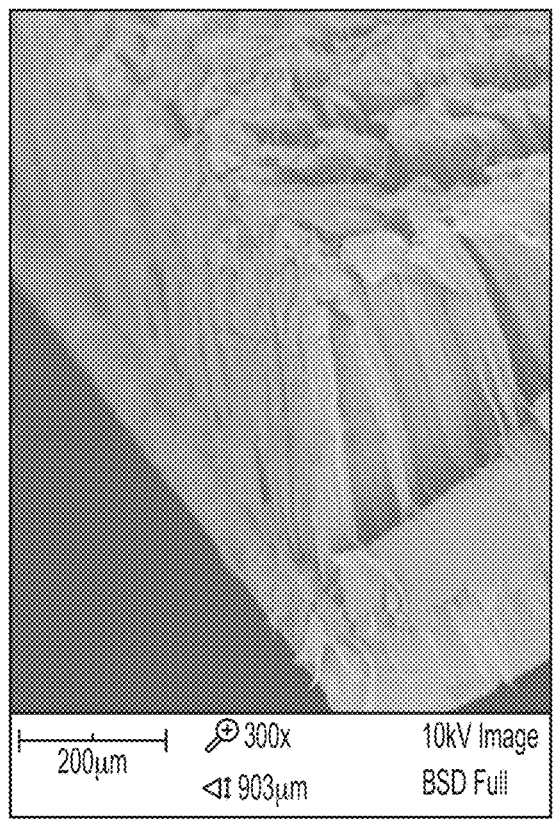
FIG. 1A is a perspective view scanning electron microscope (SEM) image of a carbon nanotube forest (alternatively referred to herein as a "layer") having a plurality of individual nanotubes, each of which includes a straight portion and an arcuate portion, in an embodiment.
Figure 1A:
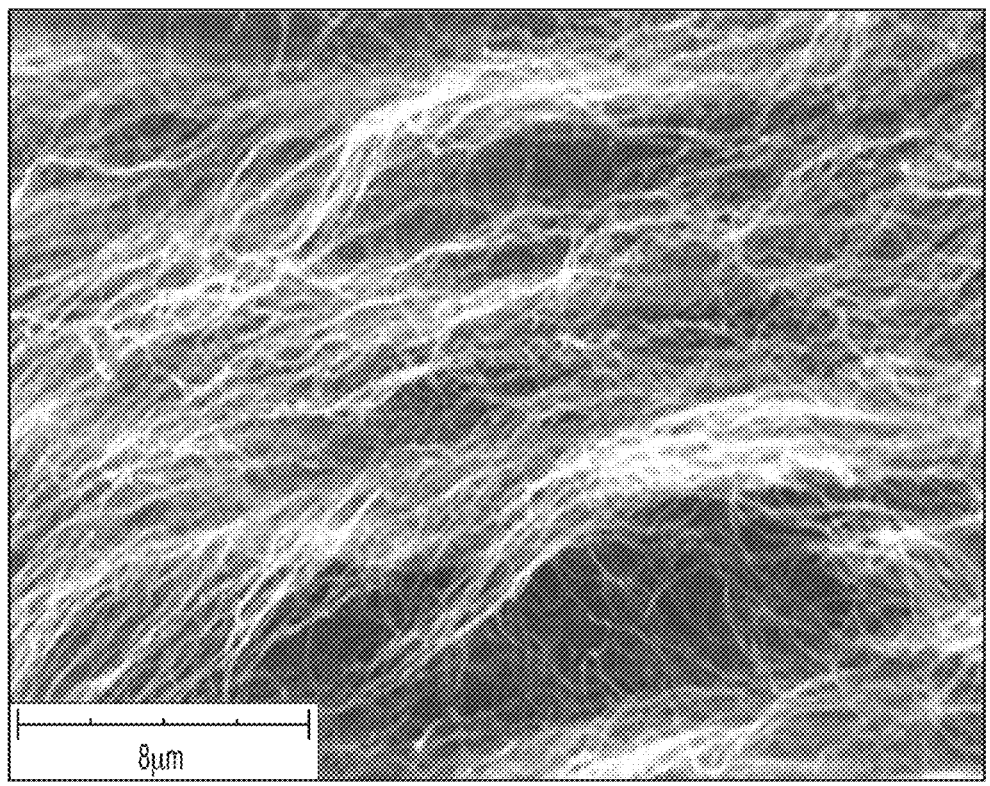

The figures depict various embodiments of the present disclosure for purposes of illustration only. Numerous variations, configurations, and other embodiments will be apparent from the following detailed discussion.

DETAILED DESCRIPTION

Overview

As used herein, the term "nanofiber" means a fiber having a diameter less than 1 μm. Both carbon-based materials (e.g., carbon nanotubes) and non-carbon-based materials may be considered "nanofibers" for the purposes of this disclosure.

As used herein, the term "carbon nanotube" encompasses both single walled carbon nanotubes and/or multi-walled carbon nanotubes in which carbon atoms are linked together to form a cylindrical structure. In some embodiments, carbon nanotubes as referenced herein, have between 4 and 10 walls. The dimensions of carbon nanotubes can vary greatly depending on production methods used. For example, the diameter of a carbon nanotube may be from 0.4 nm to 100 nm and its length may range from 10 μm to 55.5 cm. Carbon nanotubes are also capable of having very high aspect ratios (ratio of length to diameter) with some as high as 132,000,000:1 or more. Given the wide range of dimensional possibilities, the properties of carbon nanotubes are highly adjustable, or tunable. While many intriguing properties of carbon nanotubes have been identified, harnessing the properties of carbon nanotubes in practical applications requires scalable and controllable production methods that allow the features of the carbon nanotubes to be maintained or enhanced.

Embodiments described herein include a nanofiber layer that is configured to facilitate conduction of thermal energy. For example, embodiments disclosed herein have unexpectedly high thermal conductivity. Furthermore, the thin cross-sectional thickness of nanofiber layer described herein (e.g., less than 100 microns, less than 50 microns, and less than 25 microns) facilitates conformal adhesion of the layer to adjacent surfaces. Because nanofibers layers herein have a high thermal conductivity and are highly conforming to adjacent surfaces, the nanofiber layers can be used as one component in a thermal conductance system or device (e.g., a heat sink).

Some of the embodiments described herein are composed of a substrate and a layer of oriented nanofibers, conveniently referred to as a nanofiber forest. While the embodiments herein are primarily described as fabricated from carbon nanotubes, it will be appreciated that other carbon allotropes, whether graphene, micron or nano-scale graphite fibers and/or plates, and even other compositions of nano-scale fibers such as boron nitride may be used to fabricate nanofiber layers using the techniques described below. Nanofiber layers of the present disclosure can be used as a highly conductive thermal interface material having a thermal conductivity high enough (or equivalently, a thermal resistance low enough) to improve the removal of waste heat from a heat source. In particular, embodiments described herein can improve the conductivity at interfaces between a heat source and a heat sink. Conductivity of embodiments described herein can be tailored to an application by selecting an angle (or orientation) of nanofibers with respect to a substrate such as a heat source or heat sink.

Nanofibers (or other nano-scale materials) used to fabricate embodiments of nanofiber layers (also referred to as "forests"), as described herein, are disposed on a substrate and are aligned in a common direction. In one embodiment, this aligning occurs by first compressing the nanofibers between substrates so that a longitudinal axis of a fiber is more aligned with a surface of the substrates (whereas, the fibers typically are more perpendicular to the surface of the substrates in an as-deposited state). In other embodiments, this compressive force stage is omitted. Regardless, the fibers can be (re-)oriented by applying a tensile force to the fibers. This tensile force is transmitted to the fibers through adhesive disposed on the substrates or by a substrate that is inherently adherent (rather than being adhesive through a separate adhesive layer). The tensile force, in cooperation with the adhesion of the substrate, pulls the nanofibers to a common direction that is less aligned with the plane of (i.e., more perpendicular to) an underlying substrate. In some examples, the direction of more than 50, 75 or 90% of the erected straight ends of nanofibers is approximately (+/− from 0° to 10°) perpendicular to a substrate. In other examples, the direction of more than 50%, 75%, or 90% of the aligned straight ends of nanofibers is between 30° and 60° with respect to a substrate on which the nanofibers are disposed.

As used herein, the angle of a nanofiber with respect to a substrate is the angle formed between the plane of the substrate at the point of contact and a straight line connecting the base (proximal end) of the fiber with the distal end of the fiber.

Embodiments disclosed also include methods to control an angle of orientation of nanofibers with respect to an underlying substrate surface. This is beneficial for at least the reason that the angle of nanofiber orientation can be selected to maximize conductance of thermal energy (including infra-red radiation) from a substrate. In some examples, nanofiber orientation can be patterned (e.g., have a plurality of regions, each region including nanofibers aligned in a direction different from nanofibers of another region of the plurality) so as to selectively conduct thermal energy from an underlying substrate in a corresponding pattern. This can be helpful for curved or textured surfaces because nanofiber orientation can be patterned so that the angle of nanofiber orientation is substantially perpendicular (i.e., within +/− 10° relative to perpendicular) to a surface of the underlying curved or textured substrate. This ability to select and/or pattern an orientation of nanofibers of a layer separately from the orientation of an underlying surface is unusual given that typically fabricated nanofiber layers include nanofibers that are either perpendicular to a growth substrate or parallel to a growth substrate. Furthermore, the conformability of the nanofiber layers described herein is also helpful for conducting thermal energy from an underlying substrate that includes a textured surface because contact can be established and maintained between the nanofiber layer and the textured surface even for texture feature sizes as small as 1 micron or 0.5 microns.

Embodiments disclosed herein also include methods of fabricating the nanofiber layer. In one example, layers of nanofibers within a multi-layer (e.g., at least two-layer) stack of nanofibers are separated from one another. This separation exposes the aligned and "open" ends (e.g., an open end of a nanotube that receives incident radiation and is not otherwise occluded) of at least one layer of nanofibers. By exposing a surface at which "open" ends of aligned nanofibers are disposed, a nanofiber layer with an unusually and unexpectedly high conductance of thermal energy is produced. In some examples, the orientation of individual nanofibers within a layer of nanofibers is determined, in part, by an adhesive strength of an adhesive used to separate the adjacent layers of nanofibers. The stronger the adhesive, the greater the force required to separate the nanofibers from the adhesive, the closer to perpendicular the nanofibers are to a plane defined by a surface of a substrate. The weaker the adhesive, the closer the angle is to 30° relative to the plane defined by the surface of the substrate. In some examples, selecting the relative adhesive strength of the first substrate compared to the second substrate is used to determine orientation of the nanofibers on the substrates.

As mentioned above, this enables the angle of nanofibers to be controlled (and selected) so as to improve the conductance of thermal energy from an underlying surface, regardless of the orientation or texture of an underlying surface to which the nanofiber layer is attached. Different portions of the same layer can be oriented at different angles by, for example, using a substrate having a pattern of varying adhesiveness along the length and/or width of the substrate.

Applications for embodiments described herein are varied. One example application is that of a thermal interface material that can be used to facilitate conduction from a heat source to a heat sink. Another example application is that of an adhesive thermal interface material that, in addition to conforming to one or more surfaces and conducting thermal energy, may also adhere to one or more surface.

Configuration of Nanofibers within a Nanofiber Layer

Nanofibers that comprise a thermally conductive layer of the present disclosure ("nanofiber layer" or "nanofiber forest" for brevity) typically have two portions in their as-deposited form (prior to applying fabrication methods described below that can be manipulated to increase a thermal conductivity (or equivalently, reduce a thermal resistance) of the nanofiber layer). With reference to FIGS. 1A and 1A', one portion is a "straight portion" (that terminates in an "open end") that connects to, and is disposed near, a growth substrate. The other portion is "an arcuate portion" (also sometimes referred to as a "tangled end") that is disposed at an exposed surface of the nanofiber layer and that bends away from a longitudinal axis of the straight portion. These ends are indicated in the scanning electron microscope (SEM) image of FIG. 1A taken at a magnification of approximately 300× and an accelerating voltage of 10 kV. FIG. 1A' is a top view of a nanofiber layer and shows the tangled nature of the arcuate portions.

One feature of some embodiments of the present disclosure is that, unlike as-deposited nanofiber layers, an exposed surface of the nanofiber layer is not tangled but rather "open." That is, an exposed surface of a nanofiber layer is comprised of at least one of (1) straight (and in some cases aligned) portions of the nanofibers and (2) ends of nanotubes that are at least partially un-occluded (e.g., by arcuate ends, walls or fragments of nanofibers, catalyst particles). In many cases, the open ends may be positioned in a more planar arrangement with regard to each other than are the arcuate ends. In one embodiment, disposing open ends of nanofibers at an exposed surface is accomplished by "flipping" the orientation of nanofibers from that found in the as-deposited state using adhesive substrates. In another embodiment, this configuration is accomplished by removing the arcuate portions (e.g., by laser, cutting, or pulling off arcuate portions using an adhesive substrate). Regardless, this configuration (and methods of fabrication used to achieve this configuration) improves thermal energy conductance of the nanofiber layer.

FIG. 1B schematically illustrates one example of a layer of the present disclosure in which nanofibers are oriented perpendicularly (i.e., at approximately 90°) to a surface of an underlying substrate with open ends exposed. As shown, a nanofiber layer 100 includes a substrate 104 and a plurality of individual nanofibers 108 in a nanofiber layer 110 disposed on the substrate 104. In the embodiment shown in both FIG. 1B and FIG. 1C, each individual nanofiber 108 includes a straight portion 112 (corresponding to a "longitudinal axis" of each fiber), the open end of which is disposed at an open end of a nanofiber (in other words, the straight portion 112 terminates at an open end of the nanofiber). The open ends of the nanofibers are disposed proximate to an exposed surface of the layer 110 (i.e., opposite the substrate 104). Each individual nanofiber 108 also includes an arcuate portion 116 integral with the straight portion 112 and disposed at a second end of the nanofiber 108. The arcuate portion 116 is proximate to the substrate 104 and opposite to the open end of the nanofiber 108. The arcuate portion 116 is included only for illustration of one embodiment and it will be appreciated that depending on the method used to fabricate the layer 100, arcuate portions 116 may be removed or absent.

As schematically shown in FIGS. 1D and 1E, in embodiments an average angle of nanofibers with respect to a substrate can be selected from 30° to 90°. FIGS. 2A to 2G are SEM images (300× magnification at 10 kV of accelerating voltage) of nanofiber layers in cross-section, each of which has an average nanofiber angle from 60° and 90°. Layers with nanofibers oriented at an angle from 30° to 90° can be beneficial in some applications because the nanofiber orientation can be selected to maximize thermal conductivity of the nanofiber layer with respect to one or more adjacent surfaces. Methods for manufacturing a nanofiber layer 110 in these configurations are described below.

Methods for Fabricating a Nanofiber Layer

Figure 3:
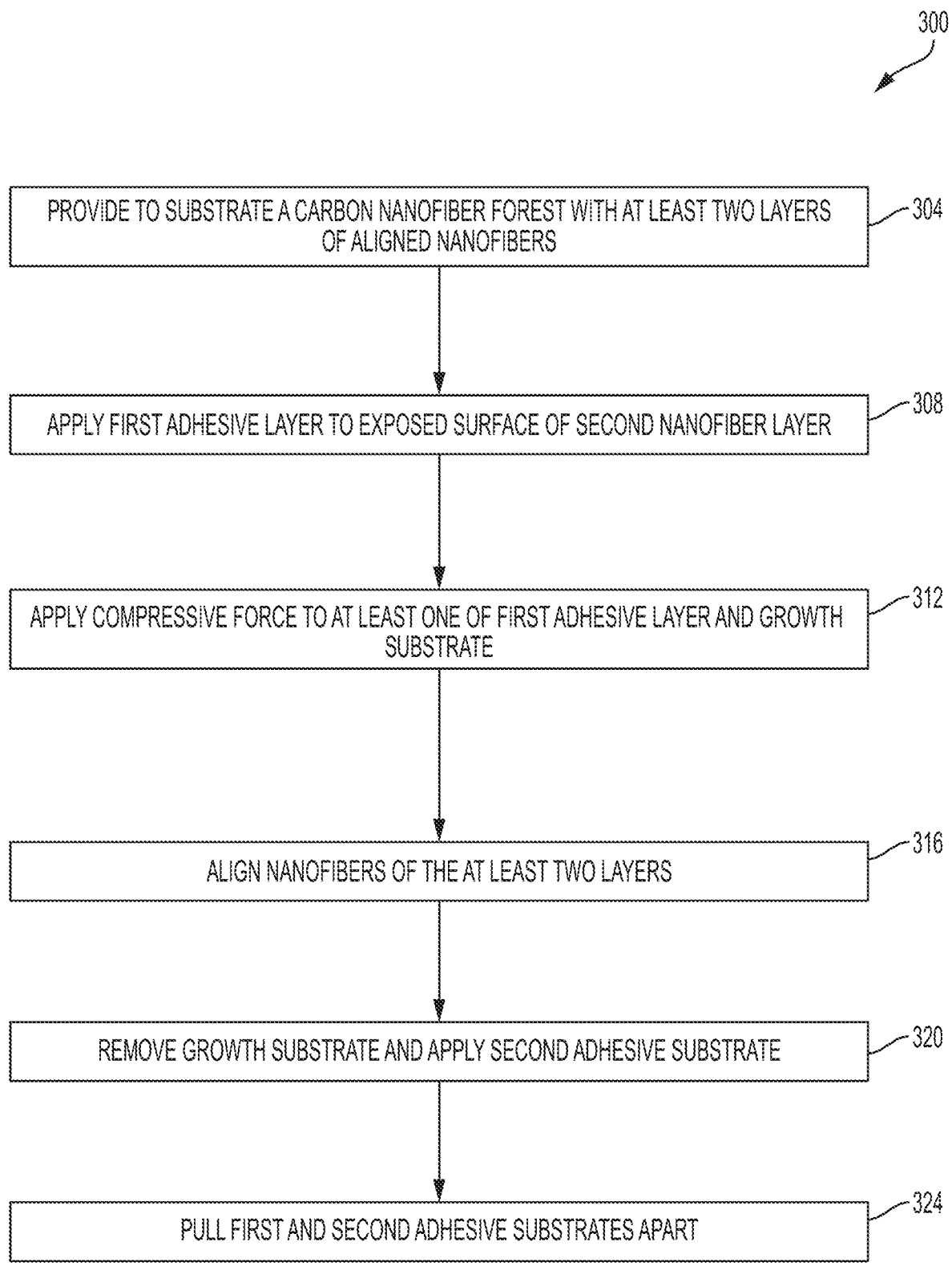
FIG. 3 is a method flow diagram for a method of fabricating a nanofiber layer of the present disclosure, in an embodiment.

A nanofiber layer, such those shown in FIGS. 1A, and 2A-2G, and schematically illustrated in FIGS. 1B to 1E, is fabricated by an example method 300, elements of which are shown in the method flow diagram of FIG. 3. Schematic illustrations of the various stages of the method 300 appear in FIGS. 4A to 4H to facilitate explanation of the method.

The method 300 begins by providing 304 a nanofiber forest to a substrate with at least two distinct layers of nanofibers (also referred to as a "nanofiber stack"). Fabrication of a single layer carbon nanofiber forest is disclosed in, for example, PCT Patent Application Publication No. WO2007/015710, which is incorporated by reference herein in its entirety. This type of forest is a precursor to embodiments described herein that can be used to produce nanofiber layers and stacks of layers, as described below in more detail. As used herein, a forest (or a layer) of nanofibers or carbon nanotubes refers to an array of nanofibers having approximately equivalent dimensions that are arranged substantially parallel to one another on a substrate where a longitudinal axis of at least 90% of the nanofibers is substantially perpendicular to a surface of the substrate on which the nanofibers are disposed.

In some embodiments, the nanofibers of the forest may each be oriented with respect to a growth surface of the substrate at a common angle that is greater than or less than 90°. For example, the nanofibers of the forest may be angled between 45° and 135° in relation to the surface of the substrate. In particular embodiments, the nanofibers of the forest may be oriented between 75° and 105° from the surface of the substrate and in select embodiments the nanofibers may be oriented approximately 90° from the substrate.

Nanofiber forests as disclosed herein may be relatively dense. Specifically, the disclosed nanofiber forests may have a density of approximately 10 billion to 30 billion nanofibers/cm$^2$. In some specific embodiments, a nanofiber forest as described herein may have a density of between 15 billion and 25 billion nanofibers/cm$^2$. The forest may include areas of high density or low density and specific areas may be void of nanofibers. These variations can be accomplished by selectively patterning a catalyst on the growth substrate (which in some embodiments is stainless steel) to select the density, height and other physical dimensions, and electrical, mechanical, and thermal properties of the forest on the substrate. The nanofibers within a forest may also exhibit inter-fiber connectivity. For example, neighboring nanofibers within a nanofiber forest may be attracted to one another by van der Waals forces. Various methods can be used to produce nanofiber forests in accordance with the subject disclosure. For example, in some embodiments nanofibers may be grown in a high-temperature furnace. In some embodiments, catalyst may be deposited on a substrate, placed in a reactor and then may be exposed to a fuel compound that is supplied to the reactor. Substrates can withstand temperatures of greater than 800° C. or even 1000° C. and may be inert materials. The substrate may comprise stainless steel or aluminum disposed on an underlying silicon (Si) wafer, although other ceramic substrates may be used in place of the Si wafer (e.g., alumina, zirconia, $SiO_2$, glass ceramics). In examples where the nanofibers of the forest are carbon nanotubes, carbon-based compounds, such as acetylene may be used as fuel compounds. After being introduced to the reactor, carbon atoms from the fuel compound(s) may then begin to accumulate on the catalyst and may assemble by growing upward from the substrate to form a forest of nanofibers. The reactor also may include a gas inlet where fuel compound(s) and carrier gasses may be supplied to the reactor and a gas outlet where expended fuel compounds and carrier gases may be released from the reactor. Examples of carrier gases include hydrogen, argon, and helium. These gases, in particular hydrogen, may also be introduced to the reactor to facilitate growth of the nanofiber forest. Additionally, dopants to be incorporated in the nanofibers may be added to the gas stream.

The reaction conditions during nanofiber growth can be altered to adjust the properties of the resulting nanofiber forest. For example, particle size of the catalyst, reaction temperature, gas flow rate and/or the reaction time can be adjusted as needed to produce a nanofiber forest having the desired specifications. In some embodiments, the position of catalyst on the substrate is controlled to form a nanofiber forest having desired patterning. For example, in some embodiments catalyst is deposited on the substrate in a pattern and the resulting forest grown from the patterned catalyst is similarly patterned. Example catalysts include iron with a, buffer layer of silicon oxide ($SiO_2$) or aluminum oxide ($Al_2O_3$). These may be deposited on the substrate using chemical vapor deposition (CVD), pressure assisted chemical vapor deposition (PCVD), electron beam (eBeam) deposition, sputtering, atomic layer deposition (ALD), plasma enhanced chemical vapor deposition (PECVD), among others.

Figure 2D:
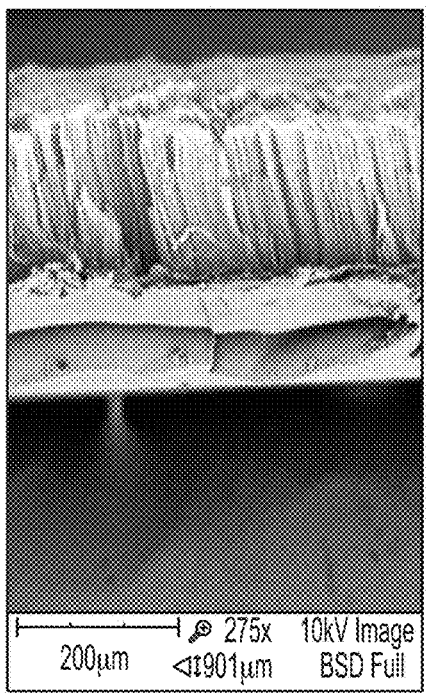
Figure 2E:
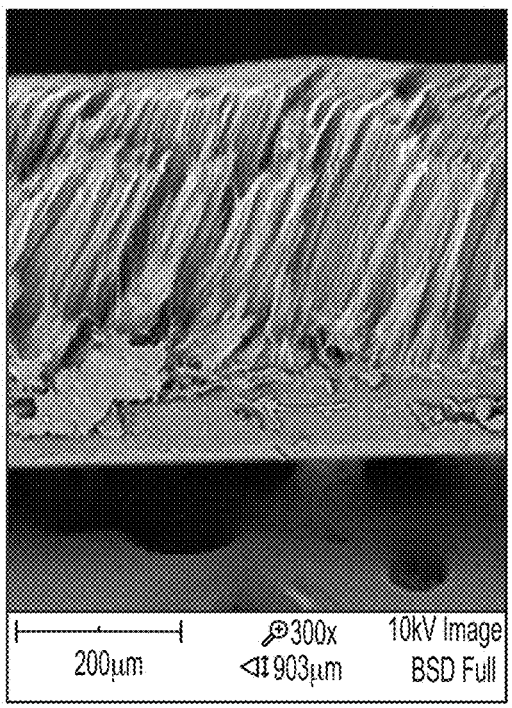
Figure 2F:
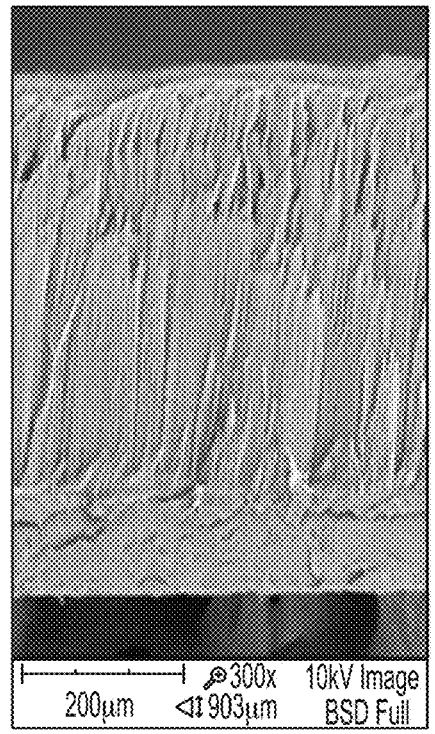
Figure 2G:
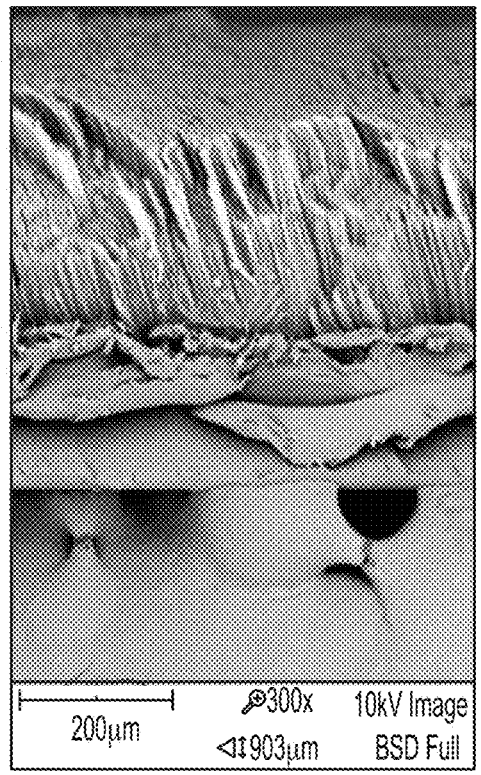
Figure 2H:
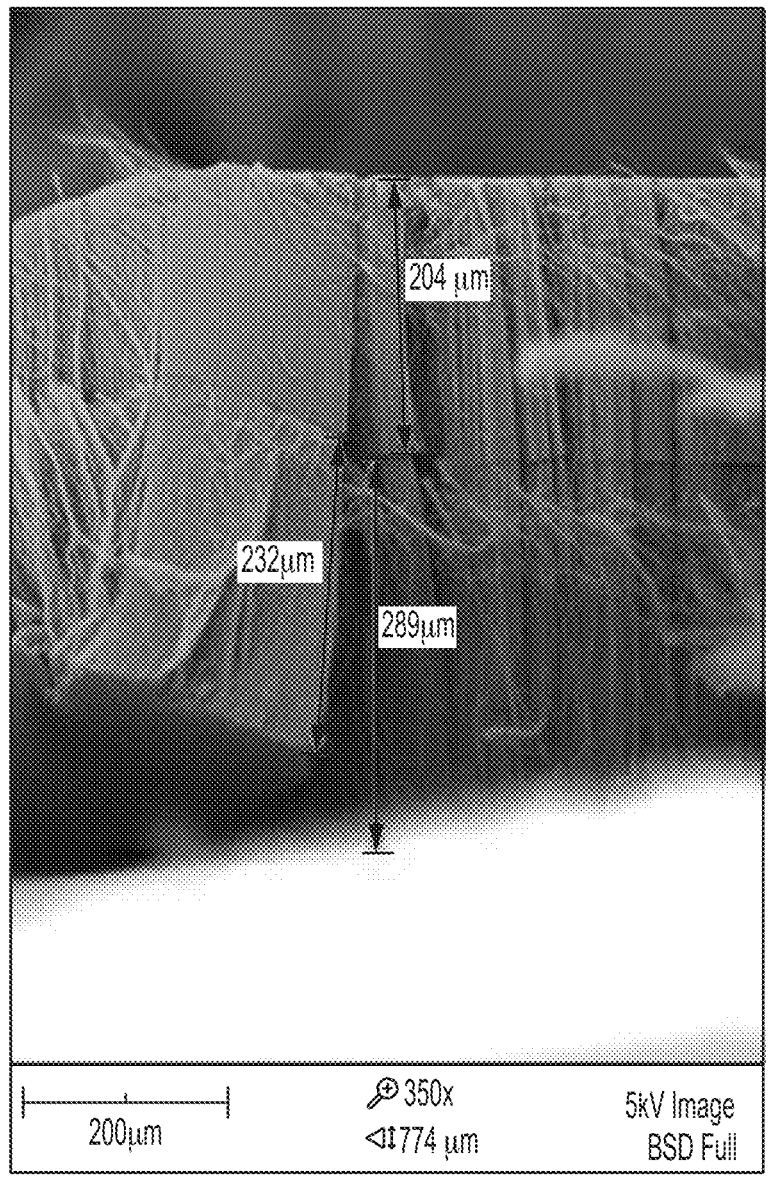
FIG. 2H is an SEM image of an example multi-layered carbon nanotube forest, in an embodiment.

In some particular embodiments, multiple nanofiber forests (or "layers") may be sequentially grown on the same substrate to form a multilayered nanofiber forest, alternatively referred to as a "stack." An example multi-layered nanofiber forest is shown in FIG. 2H, and is described below in more detail. In this process, one nanofiber forest is formed on the substrate followed by the growth of a second nanofiber layer in contact with the first nanofiber layer. Multilayered nanofiber forests can be formed by numerous suitable methods, such as by forming a first nanofiber forest on the substrate, depositing catalyst on the first nanofiber forest and then introducing additional fuel compound to the reactor to encourage growth of a second nanofiber forest from the catalyst positioned on the first nanofiber forest. Depending on the growth methodology applied, the type of catalyst, and the location of the catalyst, the second nanofiber layer may either grow on top of the first nanofiber layer or, after refreshing the catalyst, for example with hydrogen gas, grow directly on the substrate thus growing under the first nanofiber layer. Regardless, the second nanofiber forest can be aligned approximately end-to-end with the nanofibers of the first nanofiber forest although there is a readily detectable interface between the first and second forest. Multi-layered nanofiber forests may include any number of forests. For example, a multi-layered forest may include two, three, four, five or more forests.

After formation, the nanofiber forest may optionally be modified. For example, in some embodiments, the nanofiber forest may be exposed to a treatment agent such as an oxidizing or reducing agent. In some embodiments, the nanofibers of the forest may optionally be chemically functionalized by a treatment agent. Treatment agent may be introduced to the nanofiber forest by any suitable method, including but not limited to chemical vapor deposition (CVD). In some embodiments, the nanofiber forest may be modified to form a patterned forest. Patterning of the forest may be accomplished, for example, by selectively removing nanofibers from the forest. Removal can be achieved through chemical or physical means, such as laser ablation.

Figure 4A:
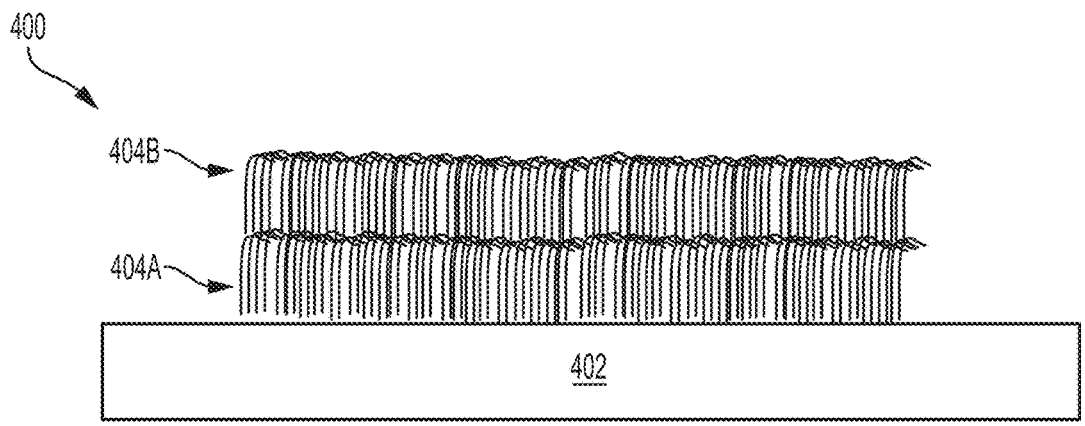
FIGS. 4A to 4H schematically illustrate the nanofiber layer at various stages of fabrication, in embodiments.

The above described process for providing 304 a forest is repeated at least once (with an intervening air and/or hydrogen reduction step to reduce the catalyst) to fabricate a nanofiber stack having at least two layers of nanofibers, in which the nanofibers within each layer are aligned. An example of a two layered nanofiber forest is, as indicated above, shown in FIG. 2H. An illustration of an embodiment of a two layer nanofiber forest 400 is shown in FIG. 4A. As shown in FIG. 4A, a nanofiber layer 404A is disposed on a growth substrate 402 (which is often fabricated from stainless steel). Nanofiber layer 404B is disposed on a surface of arcuate potions of nanofibers of the nanofiber layer 404A. As is shown, this surface of arcuate portions of the layer 404A is opposite the growth substrate 402. This configuration is consistent with the preceding explanation of nanofiber layers in their as-deposited state.

Figure 4B:
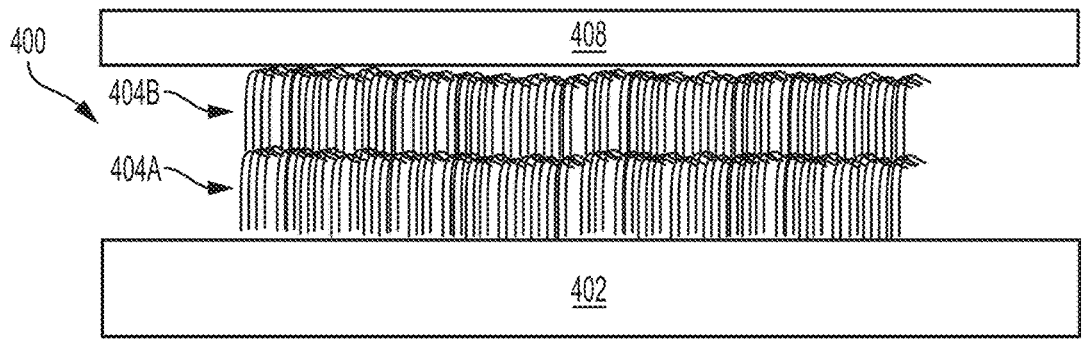

Having thus fabricated the two layer nanofiber forest 400 on the growth substrate 402, FIG. 4B illustrates a first adhesive substrate 408 that is applied 308 to the exposed surface of the nanofiber layer 404B. The exposed surface of the nanofiber layer 404B is opposite the surface in contact with nanofiber layer 404A. In examples, the first adhesive substrate 408 includes a polymer film coated with an adhesive (whether a pressure sensitive adhesive or other type of adhesive). As described elsewhere herein, the adhesive strength of the first adhesive substrate 408 is greater than that of a second adhesive substrate eventually used to replace the growth substrate 402, as described below in more detail. It is the relative difference in adhesive strengths between the first adhesive substrate and the second adhesive substrate that influences the common direction that the nanofibers are ultimately oriented in relative to the surface of the substrate.

In examples, the adhesive strength of the first adhesive substrate 408 is, when measured using a 180° peel adhesion test (sold by CHEMINSTRUMENTS® of West Chester, Ohio) in the range of 2 N/25 mm to 4 N/25 mm when pulled at a rate of 5 mm/second, after having let the first adhesive substrate 408 remain in contact with the exposed surface of the layer 404B for approximately 30 minutes (to facilitate bonding). In other examples, the range of adhesive strength is in the range of 2 N/25 mm to 3 N/25 mm, 3 N/25 mm to 4 N/25 mm, or 2.5 N/25 mm to 3.5 N/25 mm.

Figure 4C:
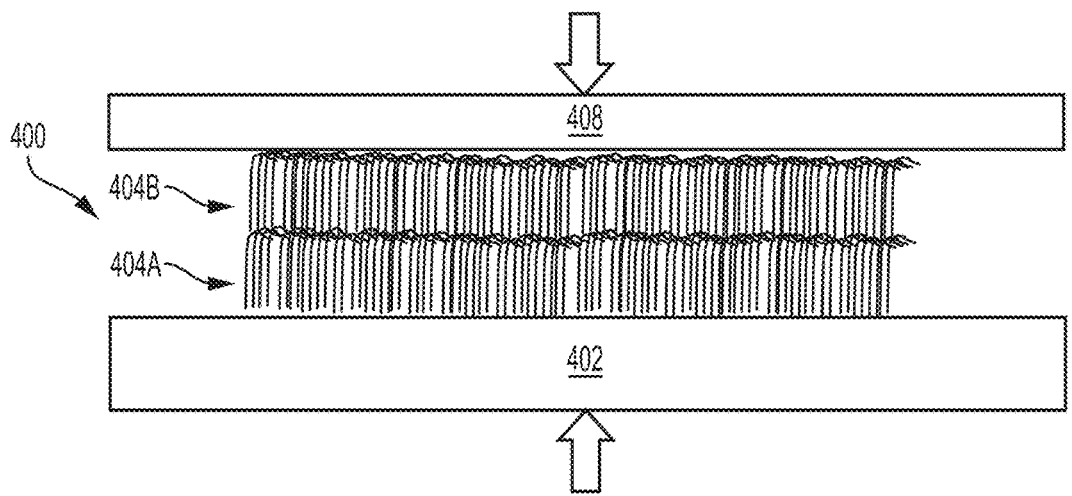
Figure 4C:
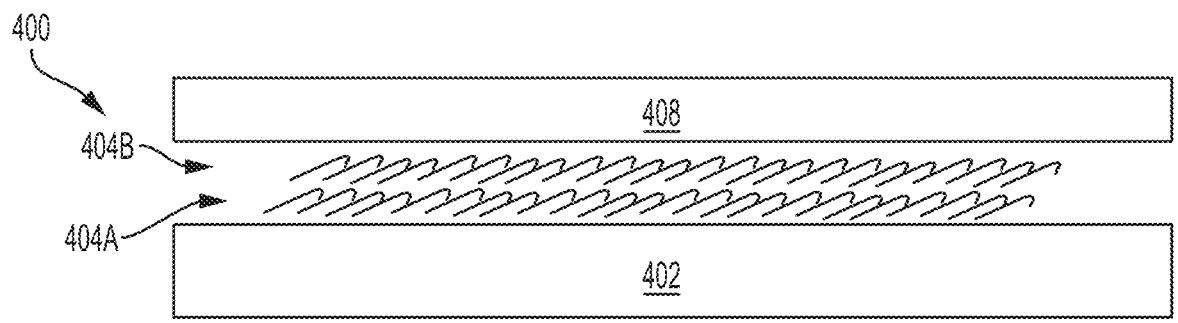

As shown in FIG. 4C, a compressive force is applied 312 to one or both of the growth substrate 402 and the first adhesive substrate 408. While FIG. 4C illustrates a normal force applied 312 both of the growth substrate 402 and the first adhesive substrate 408, it will be understood that forces can be applied 312 in a non-normal vector by, for example, a roller (or rollers), plates, or other mechanisms that squeeze the growth substrate 402 and the first adhesive substrate 408 together. Furthermore, it will be understood that while a normal force is shown in FIG. 4C, the applied force can include both normal and shear components so that the individual nanofibers of each of the layers 404A and 404B (and others in embodiments with three or more nanofiber forest layers) are moved from an as-grown orientation, in which a longitudinal axis of the individual fibers is typically substantially perpendicular to a surface of a growth substrate, to an orientation in which the longitudinal axis of the fibers is at an acute angle to or parallel with the surface of the growth substrate 402. During such a procedure, the distance between opposing substrates 402 and 408 can decrease by at least 20%, at least 30%, at least 40%, at least 50%, or at least 70%.

Regardless of the mechanism by which it is applied 312 or the relative magnitudes of compressive and shear components of the applied 312 force, the compressive force has the effect of aligning 316 the nanofibers of both layers in a common direction. One example of this is shown schematically in FIG. 4C', in which the applied 312 compressive force has aligned some or all of the individual fibers of both of the nanofiber layers 404A and 404B at an acute angle with respect to a plane of a surface of the growth substrate 402. The precise value of the acute angle at which the nanofibers of the layers 404A and 404B are disposed with respect to the surface of the growth substrate is immaterial except that it should be a lower value (i.e., closer to 0° or in other words, closer to parallel to the surface of the growth substrate 402) than the ultimately desired orientation of the fibers in the final nanofiber layer.

Figure 4D:
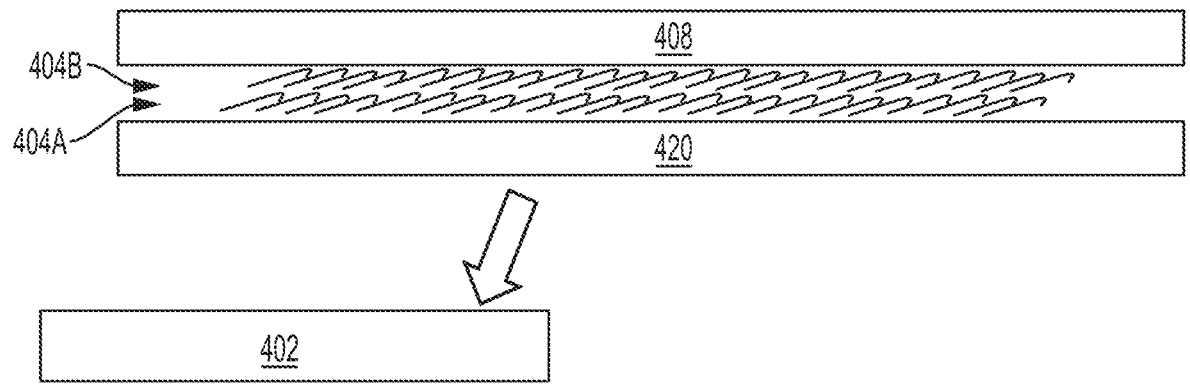

As illustrated in FIG. 4D, the growth substrate 402 is then removed 320 and a second adhesive substrate 420 is applied 312 to the surface of the first nanofiber layer 404A exposed by removal of the growth substrate 402. The adhesive strength of the second adhesive substrate 420 is selected according to an orientation of the nanofibers desired for the final nanofiber layer. For example, a second adhesive substrate 420 having an adhesive strength less than that of the first adhesive substrate 408 but in the range of 0.1 N/25 mm to 0.5 N/25 mm will adhere to the nanofibers of the layers 404A and 404B so that the fibers, at the adhesion breaking point, are pulled approximately perpendicular to the surfaces of the adhesive substrates 408 and 420. Other ranges of adhesive strengths will also facilitate this orientation, including from 0.1 N/25 mm to 0.4 N/25 mm, from 0.1 N/25 mm to 0.2 N/25 mm, from 0.2 N/25 mm to 0.3 N/25 mm, from 0.2 n/25 mm to 0.4 N/25 mm, and from 0.3 n/25 mm to 0.5 N/25 mm. It will be appreciated that while an upper limit of 0.5 N/25 mm is described, practically adhesives with even higher adhesive strengths can be used. As will be explained below in more detail, it is the relative strength between the adhesive of the first adhesive substrate relative to the adhesive of the second adhesive substrate that determines the orientation of the fibers after separating the two adhesive substrates.

In another example, the second adhesive substrate 420 having an adhesive strength that is an order of magnitude lower than those described above will facilitate orientation of the fibers at an acute angle greater than the angle achieved after the compressive force is applied (as shown in FIG. 4C') but less than the perpendicular configuration described immediately above. For example, adhesive strengths in the range of 0.01 N/25 mm to 0.05 N/25 mm will produce this orientation of nanofibers in the layer. Other ranges of adhesive strengths appropriate for this orientation include 0.01 N/25 mm to 0.02 N/25 mm, 0.01 N/25 mm to 0.04 N/25 mm, and 0.02 N/25 mm to 0.03 N/25 mm.

Because it is the relative strength of the adhesives that determines the orientation of the nanofibers after separation, the adhesive strength of the first adhesive substrate 408 and the second adhesive substrate 420 can be selected based on their relative strengths. For example, a ratio of an adhesive strength of the first adhesive substrate 408 compared to the second adhesive substrate 420 can be in a range from 4:1 to 400:1. The orientation of the fibers for different ratios is understood based on the descriptions presented above.

Figure 4E:
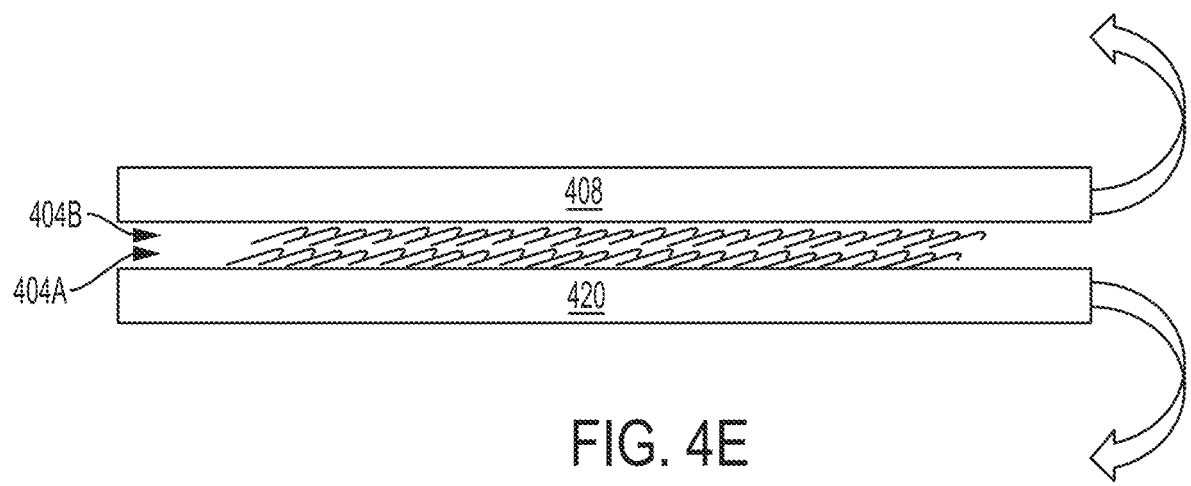

As shown in FIG. 4E, the first adhesive substrate 408 and the second adhesive substrate 420 are pulled apart 324, as indicated by the arrows in FIG. 4E. Pulling apart 420 the first adhesive substrate 408 and the second adhesive substrate 420 exposes the straight portion of the nanofibers of the second nanofiber layer 404B. As indicated above in the context of FIG. 4D, the adhesive strength of the second adhesive substrate changes the angle with which the individual nanofibers of the layers are oriented (with respect to a corresponding underlying substrate) after the two layers are pulled apart 324.

Figure 4F:
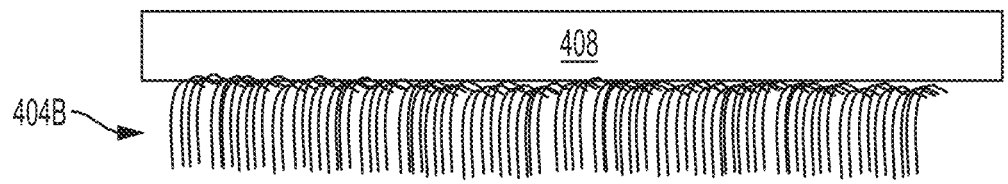

FIG. 4F illustrates one embodiment in which an adhesive strength of the second adhesive substrate 408 is in the range of, for example, 0.1 N/25 mm to 0.5 N/25 mm, as described above. As indicated above, a substrate having an adhesive strength in this range separates the nanofiber layer 404B from the nanofiber layer 404A, while also providing enough adhesive strength to re-orient the individual nanofibers from a "flattened" orientation (as shown in FIG. 4D) to an orientation in which the nanofibers are approximately perpendicular to a surface of the first and second adhesive substrates 408 and 420. This has the effect of exposing the straight ends of the individual nanofibers of the layer 404B at an exposed surface of the layer 404B and thus producing a layer having unexpected thermal properties, as described above. The surface of the layer 404A composed of arcuate ends of individual nanofibers is exposed also. In this embodiment, the adhesive strength of each of the substrates is greater than then adhesive strength that binds the two nanofiber layers together.

Figure 4G:
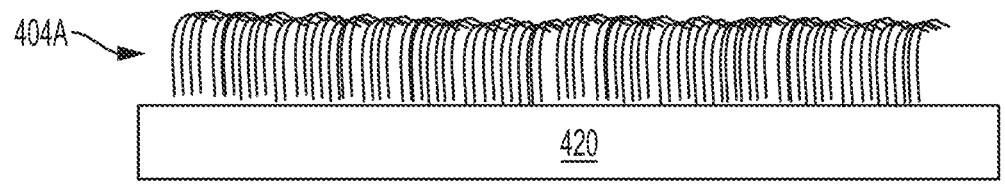

FIG. 4G illustrates one embodiment in which an adhesive strength of the substrate 408 is in the range of 0.01 N/25 mm to 0.05 N/25 mm. As indicated above, an adhesive strength in this range is sufficient to remove both of the nanofiber layers 404A and 404B from the second adhesive substrate 420, and partially re-orient the individual nanofibers from a "flattened" orientation (as shown in FIG. 4D) to an acute angle with the surface of the substrate 408 that is greater than the angle between the nanofibers and the surface of the substrate 408 in the "flattened" configuration. However, the adhesive strength of the second adhesive substrate 420 is insufficient to maintain a connection between the first layer of nanofibers 404A so that the nanofibers of both layers can be pulled into the configuration shown in FIG. 4G. Similar to the scenario shown in FIG. 4F, open ends of the nanofiber layer 404B are at an exposed surface of the layer 404B.

Figure 4H:
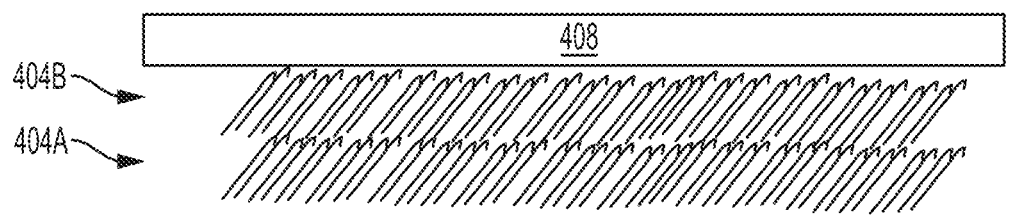
Figure 4H:
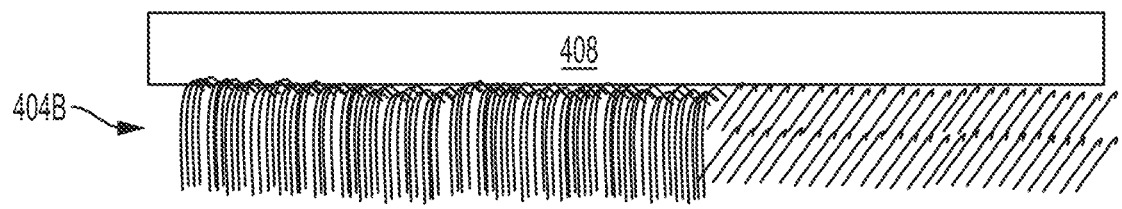

FIG. 4H illustrates another embodiment in which the adhesive strength of the second adhesive substrate 424 varies as a function of location on the surface of the second adhesive substrate 424. In this example, the adhesive strength of the second substrate 424 has a strongly adhesive portion 424A and a weakly adhesive portion 424B. Consistent with embodiments described above, the nanofiber layer 404A is patterned according the adhesive strength of the different portions 424A and 424B of the second adhesive substrate 424. That is, the nanofibers previously attached to the strongly adhesive portion 424A are in an orientation that is approximately perpendicular to the surface of the underlying first adhesive substrate 408. The nanofibers previously attached to the weakly adhesive portion 424B of the second adhesive substrate 424 are oriented at an acute angle to the surface of the first adhesive substrate 408. The example illustrates that the orientation of the nanofibers of a layer, and the corresponding thermal properties of the layer, can be selected based on a pattern of varying adhesive strengths of the second adhesive substrate.

It will be appreciated that the first and second adhesive substrates 408, 420, and 424 may be instantiated in any of a variety of forms. For example, polymer films coated in one or more adhesives may be used as some embodiments of the substrates 408 and 420, 424. In various embodiments, adhesive films can be deposited or printed on either a substrate or on the nanofiber layer itself. The polymer films can be selected according to any of mechanical, electrical, or thermal properties that are desired, whether tensile strength, optical clarity, fracture toughness, elasticity, thermal or electrical conductivity, or some other property. In other embodiments, a rigid polymer, metallic, ceramic, or composite substrate may first be coated with an adhesive (whether a "100% solids" adhesive or a pre-adhesive component that is reacted in situ to form an adhesive) and then used to orient the nanofibers of the various nanofiber layers, as described herein. In other embodiments, the substrate itself is adhesive and a secondary adhesive layer is not required. Regardless of the instantiation used, the adhesive ranges described herein still apply.

Figure 4I:
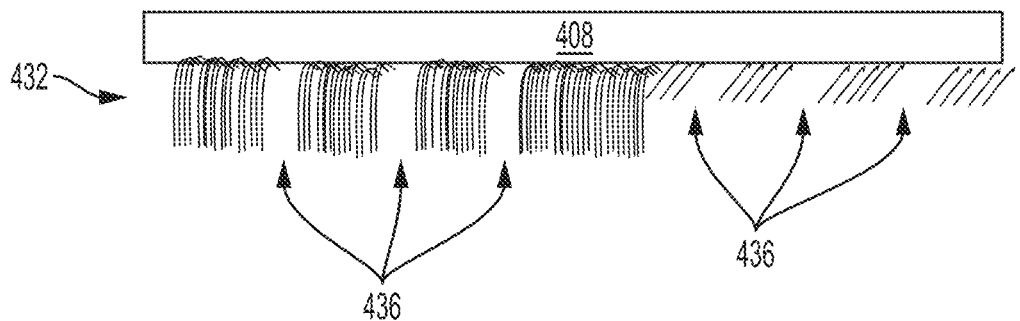
FIGS. 4I and 4J schematically illustrate a nanofiber layer configured to have a pattern of nanofibers within the layer, in embodiments.
Figure 4J:
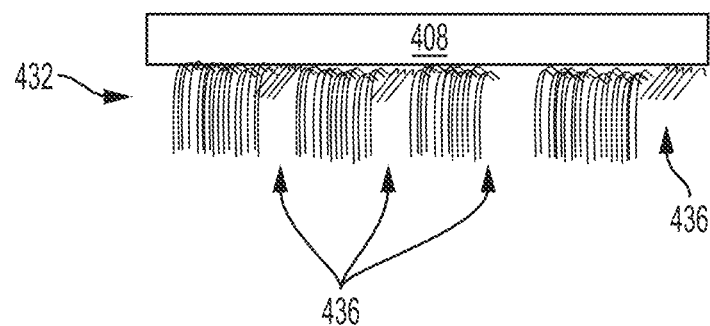

FIG. 4I illustrates an embodiment in which a nanofiber layer 432 is disposed on the substrate 408 in a pattern. Patterning a nanofiber layer 432 enables selective use of the various properties of the nanofiber layer 432. The embodiment of the pattern shown is one in which the layer 432 of nanofibers includes areas 436 that lack nanofibers. Embodiments of the methods described above can be adapted to produce such a pattern by adjusting either: (1) an adhesive strength of one or both of the substrates; or (2) a ratio of the adhesive strengths relative to one another. For example, the adhesiveness of one substrate can patterned so that nanofibers initially disposed in the layer 436 are removed from the layer 436 at locations corresponding to the areas 436. In still other embodiments, it will be appreciated that the adhesive strength (whether absolute value or ratios thereof) can be patterned to generate layer of nanofibers that is continuous, and has areas 436 of nanofibers in different orientations. Alternatively, the pattern shown in FIG. 4I can be created by patterning a catalyst on a growth substrate to prevent nanofiber growth in some portions of the substrate. In still further examples, a pattern can include areas 436 of nanofibers in different orientations as well as areas 436 in which nanofibers are absent. This latter example is shown in FIG. 4J.

Figure 4K:
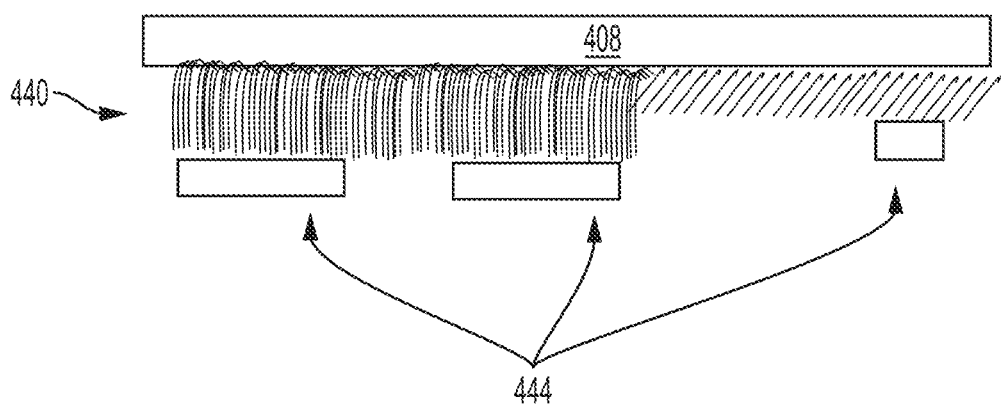
FIG. 4K schematically illustrates a nanofiber layer on which is disposed a printed pattern, in an embodiment.

FIG. 4K illustrates an embodiment in which a top layer 444 is printed on a patterned layer 440 of nanofibers. This top layer 444 is another method by which a pattern can be imposed on a nanofiber layer, thereby selecting extent to which the unusual properties of the nanofiber layer 440 are exhibited. Any printing technology can be used to deposit the top layer 444 on the layer 440 of nanofibers. These technologies include, for instance, ink jet printing, transfer printing and screen printing. Applications for printing the top layer 444 include depositing a reflective material (e.g., a metal) as the layer 444, thereby generating a pattern that can have multiple different thermal conductivities. Another example application includes depositing a material as the top layer 444 that has a low infra-red radiation emissivity, thereby creating a pattern that is alternately highly emissive in the IR band (corresponding to the areas of the nanofiber layer 440) and negligibly emissive in the IR band (corresponding to the low emissivity material in the top layer 444).

In still further embodiments, depending on the substrate selected, the oriented layers may be wound or rolled for convenience of fabrication, shipment, or use in subsequent manufacturing processes. In still other embodiments, the first adhesive substrate can include a double-sided adhesive tape.

Adhesive Carbonization

An optional process can be performed that can improve the thermal conductivity of an adhesive layer. For example, the process can reduce the thickness of the adhesive layer on any of the various substrates described above, thus improving its thermal conductivity. This "carbonizing" process removes some of the adhesive material disposed on the substrate (e.g., substrate 408 and/or substrate 420) by heating. By heating (e.g., the substrate or the adhesive directly) and thus removing some of the adhesive material, the thickness of the adhesive layer decreases. This decrease improves the overall thermal conductivity of the oriented nanofiber forest on the substrate (and any intervening adhesive layers) by reducing the thermal resistance of the various interfaces, thus improving the thermal interface material performance and the thermal conductance from the heat source to the heat sink via the layer of nanofibers. Carbonizing can be completed with little or no reduction in adhesiveness.

Figure 5A:
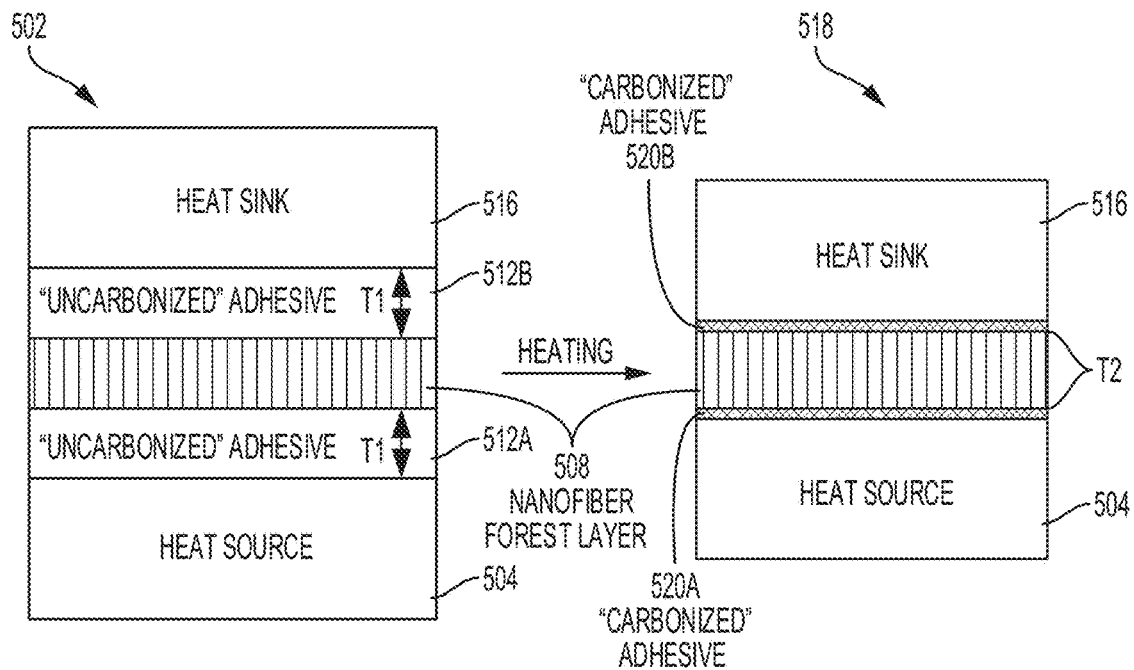
FIG. 5A is an illustration a first configuration in which a nanofiber forest of the present disclosure used as a thermal interface layer between a heat source and a heat sink, and a second configuration in which a nanofiber forest is used as a thermal interface layer and is attached to a heat source and a heat sink using carbonized adhesive layers, in embodiments.
Figure 5B:
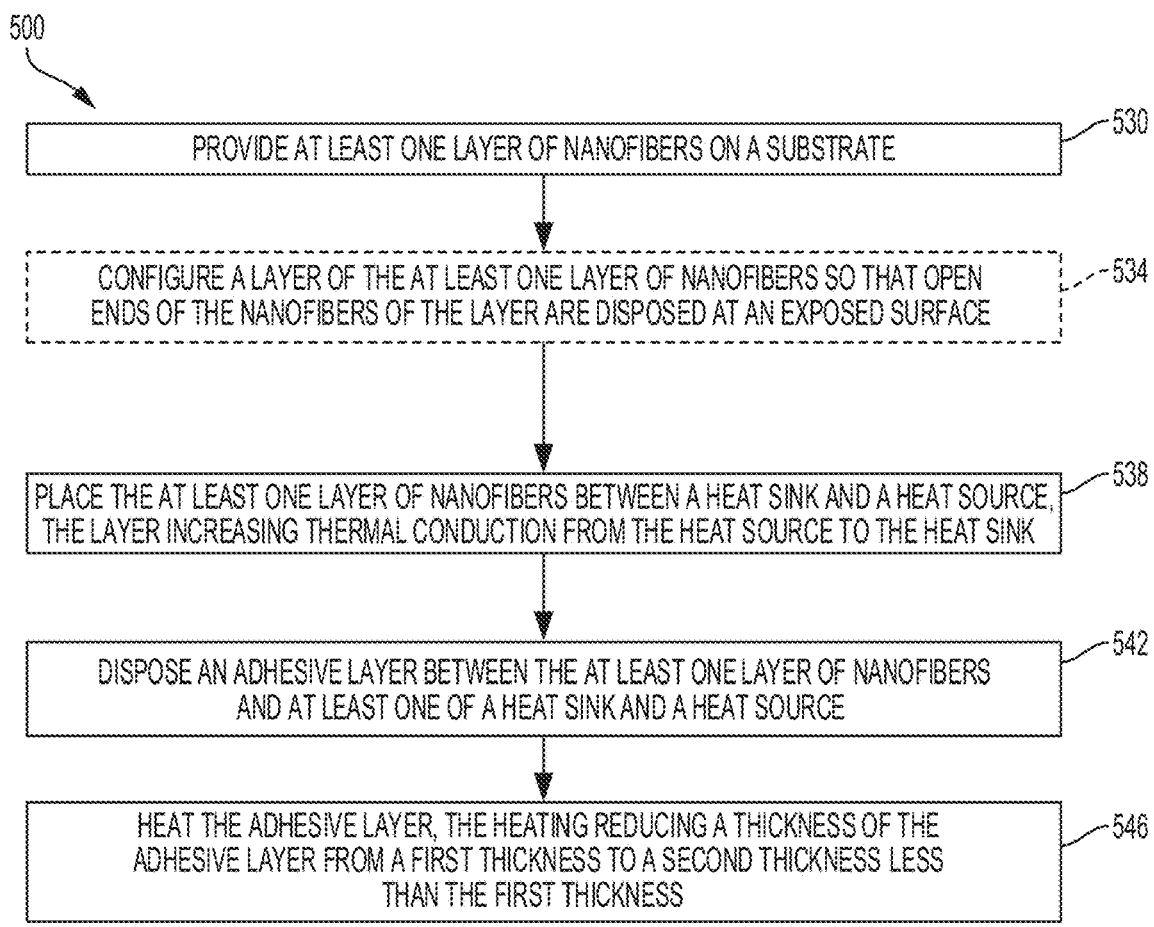
FIG. 5B is an example method flow diagram for using a nanofiber forest as a thermal interface layer, in an embodiment.

A schematic illustration of this process is illustrated in FIG. 5A. Concurrent reference to a method flow diagram FIG. 5B that illustrates an example method 500 for preparing some embodiment of the present disclosure that include at least one carbonized adhesive layer will facilitate explanation.

The example method 500 begins by providing 530 at least one layer of nanofibers on a substrate, a majority of the nanofibers oriented at an angle that is substantially perpendicular to a surface of the substrate and then by configuring 534 a layer of the at least one layer of nanofibers. In some embodiments, the nanofibers are optionally configured 534 so that open ends of the nanofibers of the layer are disposed at an exposed surface. The providing 530 and configuring 534 have been described above (e.g., in the context of FIGS. 3, 4A-4F) and need no further explanation.

The method 500 continues by placing 538 the at least one layer of nanofibers between a heat sink and a heat source, the layer increasing a thermal conductivity (or equivalently reducing a thermal resistance) of the interface so as to improve thermal conduction (in relation to an alternative adhesive system) from the heat source to the heat sink. In some examples, an orientation of the nanofibers within the at least one layer is substantially perpendicular (i.e., from 80° to 100°) to an interface with the heat sink and/or heat source. In different embodiments, the open end of the fibers may be proximal to either the heat source or the heat sink. An adhesive layer is then disposed 542 between the at least one layer of nanofibers and one of a heat sink and a heat source. This is illustrated in configuration 502 of FIG. 5A. In this configuration 502, a nanofiber forest 508 is disposed between adhesive layers 512A, 512B. The adhesive layer 512A is disposed between the nanofiber forest 508 and a heat source 504. The adhesive layer 512B is disposed between the nanofiber forest 508 and a heat sink 516. While two adhesive layers are shown in the example configuration 502, it will be appreciated that in other configurations only one of the adhesive layers 512A, 512B is present. As also described above, the adhesive layers 512A, 512B in the configuration 502 are "uncarbonized." That is, the adhesive layers 512A, 512B have not been heated to partially combust (or "carbonize") some of the carbon atoms and/or volatile components of the adhesive so as to reduce a thickness of the adhesive layers.

The method 500 continues by heating 546 the configuration 502, and more specifically the adhesive layers 512A, 512B. The heating 546 reduces the thickness of the adhesive layers from a first thickness T1 to a second thickness T2 less than the first thickness T1. This change is illustrated in configuration 518 of FIG. 5A, in which the heat applied to the configuration 502 has transformed the "uncarbonized" adhesive layers 512A, 512B to "carbonized" adhesive layers 520A, 520B. In some examples, the heating 546 includes heating the adhesive layers 512A, 512B to a temperature of 300° C. (+/− within 10% according to normal process variability and measurement precision). This reduction in thickness can, in some examples, increase a thermal conductivity (or equivalently reduce a thermal resistance) from the heat source 504 to the heat sink 516 through the carbonized adhesive layers 520A, 520B and the nanofiber forest 508.

EXPERIMENTAL EXAMPLE

In one example, one forest layer from an initial double-layer forest was transferred to a copper film with adhesive layer on the surface. This transfer was accomplished using the methods already described above. A height (a dimension from a surface of the forest in contact with the copper film and an exposed major surface of the forest) of the single transferred forest was measured, and found to be approximately 68 microns. The initial adhesive thickness was 7 microns. Samples were placed in a furnace at 300° C. in ambient atmosphere. Scanning electron microscope (SEM) images were taken of a cross section of the samples after various heating times to measure adhesive thickness. Results follow in Table 1.

TABLE 1

| Adhesive Thickness | Time |
| --- | --- |
| 7 um | 0 min |
| 1 um | 15 min |
| 0.6 um | 20 min |
| 0.1 um | 30 min |

As indicated above, the thinner the adhesive thickness, the more thermally conductive the thermal interface material is.

Furthermore, it will be appreciated that in some cases the ability of a nanofiber forest to conform to underlying topography of a substrate (e.g., as little as 0.5 microns, as indicated above) is improved upon reducing a thickness of an adhesive layer. This ability of the nanofiber layer to conform to even very small surface topography in an underlying substrate increases the area of contact between the nanofiber forest and the substrate, and thereby increases the thermal conductivity (or reduce the thermal resistance) through the adhesive layer and nanofiber forest from a heat source to a heat sink.

Figure 6:
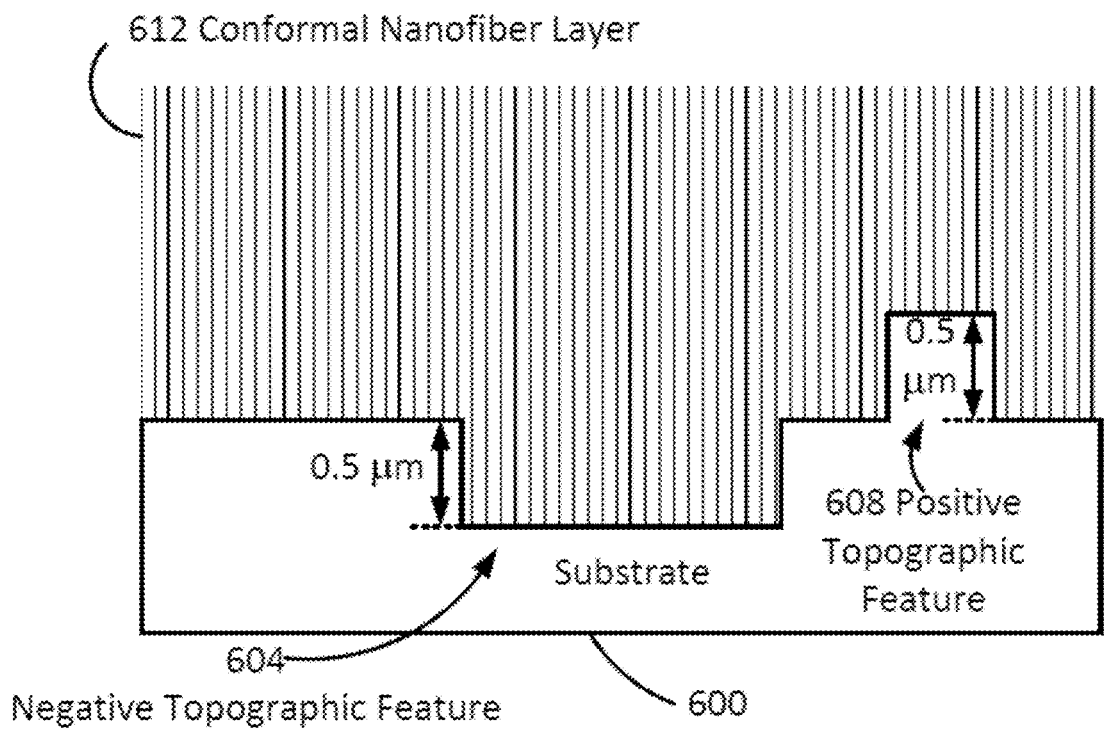
FIG. 6 illustrates a nanofiber forest conforming to a topography of an underlying substrate that is as small as 0.5 microns, in an embodiment.

This is schematically illustrated in FIG. 6. As shown, a substrate 600 includes a negative topographic feature 604 that is 0.5 μm deep (i.e., below a surface of the substrate 600 used as a measurement reference) and a positive topographic feature 608 that is 0.5 μm tall (i.e., above the surface of the substrate 600 used as a measurement reference). A nanofiber layer 612 is conformally disposed on the surface of the substrate 600 including on the topographic features 604, 608. This conformal disposition of the nanofiber layer 612 can accommodate negative topographic features (e.g., feature 604) and positive topographic features (e.g., feature 608) while maintaining planarity at an opposite, exposed surface. This ability to conform to a surface improves surface area contact with the substrate 600, which increases thermal conductivity (or reduces thermal resistance) through the layer 612. It will be appreciated that the conformal nanofiber layer 612 can also accommodate positive and negative topographic features on a structure placed on the surface shown as exposed in FIG. 6, thus further improving heat transfer from one side of the conformal nanofiber layer 612 to the opposite side, and for example from a heat source (e.g., the substrate 600) to a heat sink on an opposite side of the layer 612 from the substrate 600.

Also, as schematically shown, the orientation of the nanofibers of the conformal nanofiber layer 612 are generally substantially perpendicular (i.e., from 80° to 100°) relative to the surface of the substrate 600 on which the layer 612 is disposed. It will be appreciated that some variation in nanofiber orientation relative to the surface of the substrate, relative from one nanofiber to another, and/or within an individual nanofiber may be present. These variations may be present but are not shown for convenience of illustration. There may also be some variability as the conformal nanofiber layer 612 transitions between substrate 600 surfaces that are orthogonal to one another. It will be appreciated that, while not shown, the embodiment illustrated in FIG. 6 can include an intervening adhesive layer that, in some cases, can be carbonized, as described above. This layer is omitted from FIG. 6 for clarity of depiction. It will also be appreciated that in the embodiment of FIG. 6, open ends of the nanofibers are at an exposed surface of the conformal nanofiber layer 612, as described above. This may be reversed in alternative embodiments.

Method

Figure 7:
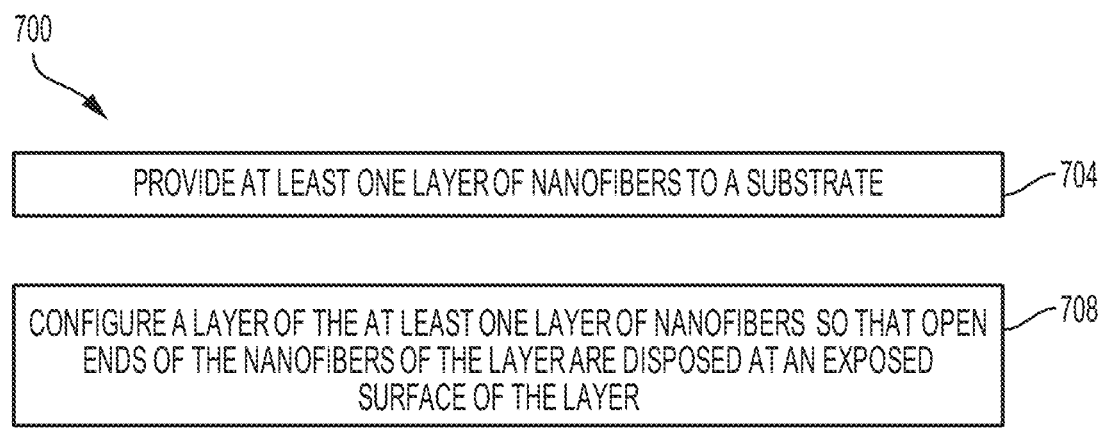
FIG. 7 is a method flow diagram for a method of fabricating a nanofiber layer of the present disclosure, in an embodiment.

FIG. 7 is a flow diagram illustrating an example method 700 for fabricating some embodiments of the present disclosure. It will be appreciated that some or all of the embodiments described above can be encompassed by the method 700.

The method 700 begins by providing 704 at least one layer of nanofibers, such as a forest, to a substrate. The at least one layer can include one, two, three, or more layers of nanofibers. Examples of substrates include growth substrates and adhesive substrates, as described above.

The method 700 continues by configuring 708 a layer of the at least one layer of nanofibers provided to the substrate so that open ends of the nanofibers of the layer are disposed at an exposed surface of the layer. This can be accomplished using any of the techniques described above. For example, an adhesive substrate can be placed on top of the at least one layer and then be separated from the substrate on which the at least one layer was provided. Depending on the relative adhesive strengths of the adhesive substrate and the substrate on which the at least one layer was provided, arcuate ends can be removed from straight portions of the nanofibers, thus exposing open ends of the nanofibers, rendering nanofibers with open ends at both proximal and distal portions. Or, for a multi-layer stack, nanofibers can be separated from one another, exposing open ends of a nanofiber layer on the adhesive substrate.

Further Considerations

The foregoing description of the embodiments of the disclosure has been presented for the purpose of illustration; it is not intended to be exhaustive or to limit the claims to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the invention, which is set forth in the following claims.

What is claimed is:

1. A method comprising:
providing at least one layer of nanofibers;
placing the at least one layer of nanofibers between a heat sink and a heat source;
disposing an adhesive layer between the at least one layer of nanofibers and at least one of the heat sink and the heat source; and
carbonizing the adhesive layer by applying heat, the carbonizing causing partial combustion of some of the adhesive layer, the carbonizing reducing a thickness of the adhesive layer from a first thickness to a second thickness less than the first thickness.

2. The method of claim 1, wherein the heat source is proximate to open ends of the nanofibers.

3. The method of claim 1, wherein the adhesive layer comprises a first adhesive layer disposed between the layer of nanofibers and the heat sink and a second adhesive layer disposed between the layer of nanofibers and the heat source.

4. The method of claim 1, wherein carbonizing the adhesive layer comprises heating the adhesive layer at a temperature of 300° C.

5. The method of claim 1, wherein the first thickness is at least 7 microns and the second thickness is from 0.1 micron to 1 micron.

6. The method of claim 1, wherein the at least one layer of nanofibers is provided on a substrate prior to the placing of the nanofibers between a heat sink and a heat source, the nanofibers oriented at an angle from 80° to 100° relative to a surface of the substrate.

7. The method of claim 1, wherein reducing the thickness of the adhesive layer from the first thickness to the second thickness increases a thermal conductivity of, collectively, the adhesive layer and the at least one layer of nanofibers from a first value to a second value greater than the first value.

8. The method of claim 7, wherein the first value of thermal conductivity is at least 30% less than the second value of the thermal conductivity.

9. The method of claim 1, wherein the at least one layer of nanofibers conforms to a feature size on at least one of the heat source and the heat sink of 0.5 microns or greater.

10. The method of claim 1, wherein an orientation of the nanofibers in the at least one layer placed between the heat source and the heat sink is from 80° to 100° relative to at least one of a surface of the heat source and a surface of the heat sink.

11. A method comprising:
providing at least one layer of nanofibers;
configuring a layer of the at least one layer of nanofibers so that open ends of the nanofibers of the layer are disposed at an exposed surface;

placing the at least one layer of nanofibers between a heat sink and a heat source, at least one of the heat sink and the heat source proximate to the open ends of the nanofibers;

disposing an adhesive layer between the at least one layer of nanofibers and at least one of the heat sink and the heat source; and carbonizing the adhesive layer between the at least one layer of nanofibers and at least one of the heat sink and the heat source, the carbonizing causing partial combustion of some of the adhesive layer.

12. The method of claim 11, wherein the at least one layer of nanofibers is provided on a substrate wherein a majority of nanofibers of the at least one layer provided on the substrate are oriented at an angle from 80° to 100° relative to a surface of the substrate.

13. The method of claim 11, wherein configuring the at least one layer of nanofibers so that open ends of the nanofibers of the layer are disposed at an exposed surface comprises:

applying an adhesive substrate to a top layer of the at least one layer of nanofibers on a substrate; and applying a tensile force to the substrate and the adhesive substrate and causing the substrate and the adhesive substrate to separate from one another.

14. The method of claim 13, wherein applying the adhesive substrate comprises:

applying an adhesive to the top layer of the at least one layer of nanofibers; and applying a second substrate to the adhesive.

15. The method of claim 13, wherein a ratio of adhesive strength of the adhesive substrate to the substrate is in a range from 4:1 to 400:1.

16. The method of claim 11, wherein an angle of the nanofibers relative to a surface of at least one of the heat sink and the heat source is from 80° to 100° relative to the surface of the surface.

17. The method of claim 11, wherein the carbonizing of the adhesive layer reduces a thickness of the adhesive layer from a first thickness to a second thickness less than the first thickness, the reduced thickness increasing a thermal conductivity of, collectively, the adhesive layer and the at least one layer of nanofibers from a first value to a second value greater than the first value.

18. The method of claim 17, wherein the first value of the thermal conductivity is at least 30% less than the second value of the thermal conductivity.

19. The method of claim 11, wherein the heat source is proximate to the open ends of the nanofibers.

* * * * *